United States Patent
Brahmadathan et al.

(10) Patent No.: US 12,282,064 B2
(45) Date of Patent: Apr. 22, 2025

(54) COMPONENT DIE VALIDATION BUILT-IN SELF-TEST (VBIST) ENGINE

(71) Applicant: Ampere Computing LLC, Santa Clara, CA (US)

(72) Inventors: Sandeep Brahmadathan, Dublin, CA (US); Jared Bendt, Hillsboro, OR (US); Nagi Aboulenein, King City, OR (US); Kedar Karandikar, Fremont, CA (US); Stephan Jourdan, Portland, OR (US)

(73) Assignee: Ampere Computing LLC, Santa Clara, CA (US)

( * ) Notice: Subject to any disclaimer, the term of this patent is extended or adjusted under 35 U.S.C. 154(b) by 0 days.

(21) Appl. No.: 17/810,254

(22) Filed: Jun. 30, 2022

(65) Prior Publication Data

US 2024/0003974 A1    Jan. 4, 2024

(51) Int. Cl.
*G01R 31/3187* (2006.01)
*G01R 31/317* (2006.01)
(Continued)

(52) U.S. Cl.
CPC .... *G01R 31/3187* (2013.01); *G01R 31/31716* (2013.01); *G01R 31/318566* (2013.01); *G01R 31/31905* (2013.01); *G01R 31/31917* (2013.01); *G06F 11/263* (2013.01); *G06F 11/27* (2013.01); *G06F 11/277* (2013.01); *G06F 30/333* (2020.01); *G11C 29/003* (2013.01); *G11C 29/022* (2013.01); *G11C 29/12* (2013.01);
(Continued)

(58) Field of Classification Search
CPC ...... G06F 30/333; G06F 11/263; G06F 11/27; G06F 11/277; G11C 2029/5602; G11C 29/003; G11C 29/12; G11C 29/38; G11C 29/1201; G11C 29/022; G01R 31/3187; G01R 31/31716; G01R 31/31917; G01R 31/318566; G01R 31/31905
See application file for complete search history.

(56) References Cited

U.S. PATENT DOCUMENTS

| | | | | |
|---|---|---|---|---|
| 2015/0008954 A1* | 1/2015 | Camarota | ...... | G01R 31/318516 324/762.03 |
| 2016/0093400 A1* | 3/2016 | Botea | ...... | G11C 29/38 714/719 |

(Continued)

*Primary Examiner* — Mark D Featherstone
*Assistant Examiner* — Sazzad Hossain
(74) *Attorney, Agent, or Firm* — Muncy, Geissler, Olds & Lowe, P.C.

(57) ABSTRACT

A component die validation built-in self-test (VBIST) engine is presented. In an aspect, a component die includes component circuitry for performing a component function, interface circuitry for communicating with another die, and a VBIST circuit. The VBIST circuit includes a traffic generator that generates test data streams, a tracker that receives and validates test data streams, and a configurable switching matrix for coupling the traffic generator to at least one of the component circuitry, the interface circuitry, or the tracker, and for coupling at least one of the component circuitry, the interface circuitry, or the traffic generator to the tracker. The VBIST circuit can send traffic to and from the component circuitry directly, or indirectly via the interface circuitry in loopback mode, and can be used for memory initialization and test.

35 Claims, 13 Drawing Sheets

(51) Int. Cl.
  *G01R 31/3185* (2006.01)
  *G01R 31/319* (2006.01)
  *G06F 11/263* (2006.01)
  *G06F 11/27* (2006.01)
  *G06F 11/277* (2006.01)
  *G06F 30/333* (2020.01)
  *G11C 29/00* (2006.01)
  *G11C 29/02* (2006.01)
  *G11C 29/12* (2006.01)
  *G11C 29/38* (2006.01)
  *G11C 29/56* (2006.01)

(52) U.S. Cl.
  CPC .......... *G11C 29/1201* (2013.01); *G11C 29/38* (2013.01); *G11C 2029/5602* (2013.01)

(56) References Cited

U.S. PATENT DOCUMENTS

| | | | |
|---|---|---|---|
| 2016/0370427 A1* | 12/2016 | Kreider | G01R 31/31703 |
| 2023/0072895 A1* | 3/2023 | Alzheimer | G11C 29/44 |
| 2023/0305737 A1* | 9/2023 | David | G06F 15/7807 |

* cited by examiner

COMPONENT DIE VALIDATION BUILT-IN SELF-TEST (VBIST) ENGINE

BACKGROUND

I. Field of the Disclosure

Aspects of the disclosure relate generally to techniques for evaluating and debugging system-on-chip (SoC) design and performance, and specifically to techniques for validating individual component dies of a multi-chip module.

II. Background

Multi-chip modules (MCMs) conventionally include multiple component dies mounted to a substrate that contains traces for power, ground, and inter-chip communication. As used herein, a component die may also be referred to as a chiplet, e.g., a compute die may be referred to as a compute chiplet, an input/output (I/O) die may be referred to as an I/O chiplet, etc. A common configuration includes a main die, which may be a compute die, that communicates with and controls other dies on the MCM, which may be other compute dies or subsidiary dies that provide I/O, memory, or other peripheral functions.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an apparatus includes a component die, comprising: component circuitry for performing a component function; interface circuitry for communicating with another die; and a validation built-in self-test (VBIST) circuit, comprising: a traffic generator that generates test data streams; a tracker that receives and validates test data streams; and a configurable switching matrix for coupling the traffic generator to at least one of the component circuitry, the interface circuitry, or the tracker, and for coupling at least one of the component circuitry, the interface circuitry, or the traffic generator to the tracker.

In an aspect, a method of validating a component die in a multi-chip module (MCM) includes, at a VBIST circuit within the component die, sending a test data stream to a first component within the component die, receiving a response to the test data stream, and validating the response to the test data stream.

In an aspect, a method of validating a component die in a MCM includes: providing, on a component die comprising component circuitry for performing a component function and interface circuitry for communicating with another die, a VBIST circuit, the VBIST circuit comprising a traffic generator that generates test data streams, a tracker that receives and validates test data streams, and a configurable switching matrix for coupling the traffic generator to at least one of the component circuitry, the interface circuitry, or the tracker, and for coupling at least one of the component circuitry, the interface circuitry, or the traffic generator to the tracker; and using the VBIST circuit to validate at least one of the VBIST circuit, the component circuitry, or the interface circuitry.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION OF THE DRAWINGS

Figure 1A:
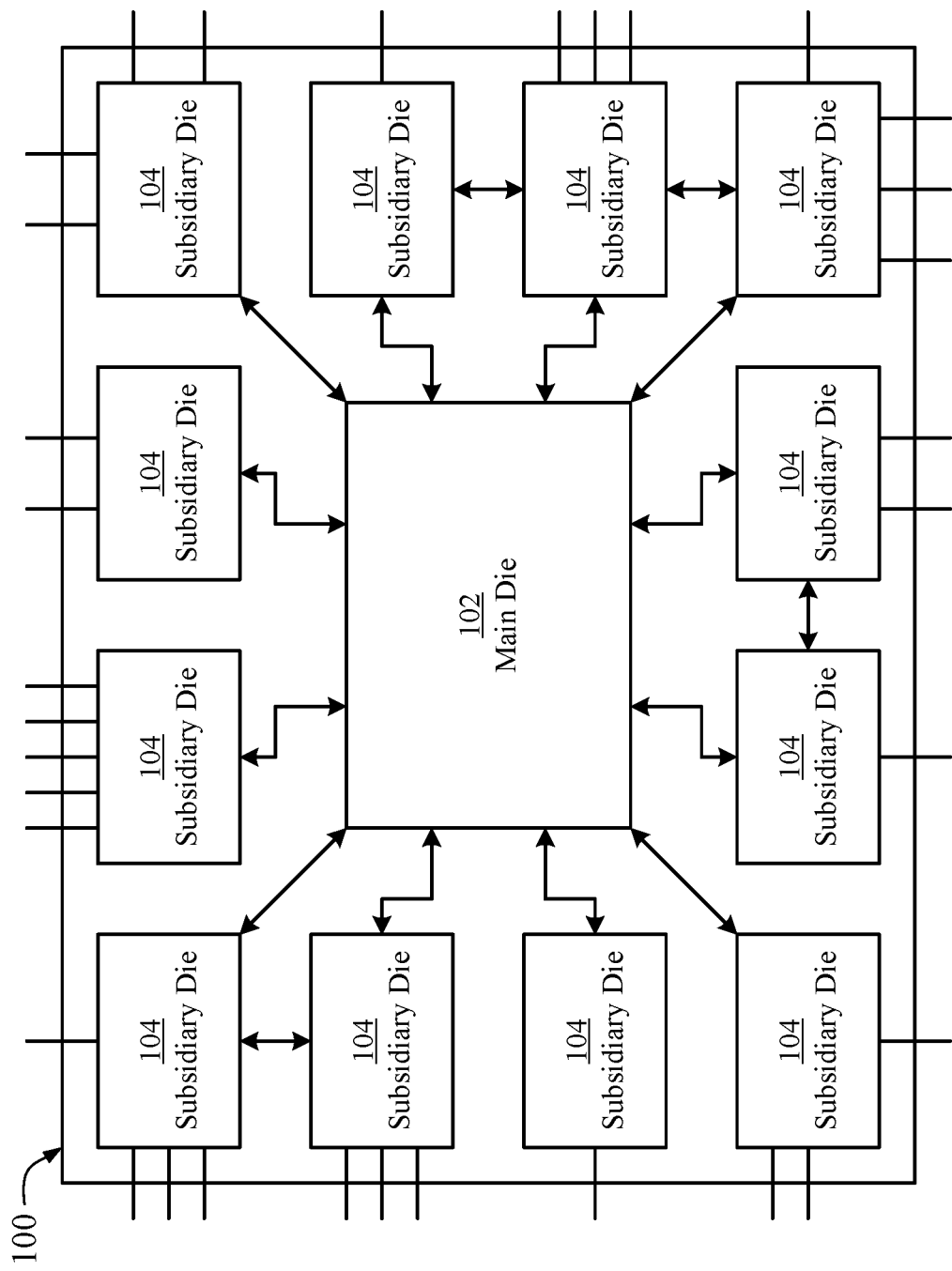
FIGS. 1A and 1B are block diagrams of portions of an example multi-chip module (MCM) that uses a validation built-in self-test (VBIST) engine, according to aspects of the disclosure.

A component die validation built-in self-test (VBIST) engine is presented. In an aspect, a component die includes component circuitry for performing a component function, interface circuitry for communicating with another die, and a VBIST circuit. The VBIST circuit includes a traffic generator that generates test data streams, a tracker that receives and validates test data streams, and a configurable switching matrix for coupling the traffic generator to at least one of the component circuitry, the interface circuitry, or the tracker, and for coupling at least one of the component circuitry, the interface circuitry, or the traffic generator to the tracker. The VBIST circuit can send traffic to and from the component circuitry directly, or indirectly via the interface circuitry in loopback mode, and can be used for memory initialization and test.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

The word "exemplary" is used herein to mean "serving as an example, instance, or illustration." Any implementation described herein as "exemplary" is not necessarily to be construed as preferred or advantageous over other embodiments. Likewise, the term "implementation" does not require that all implementations include the discussed feature, advantage, or mode of operation.

The terminology used herein describes particular implementations only and should not be construed to limit any implementations disclosed herein. As used herein, the singular forms "a," "an," and "the" are intended to include the plural forms as well, unless the context clearly indicates otherwise. Those skilled in the art will further understand that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Multi-chip modules (MCMs) conventionally include multiple component dies mounted to a substrate that contains traces for power, ground, and inter-chip communication. As used herein, a component die may also be referred to as a chiplet, e.g., a compute die may be referred to as a compute die, an input/output (I/O) die may be referred to as an I/O chiplet, etc. A common configuration includes a main die, which may be a compute die or a controller die, that communicates with and controls other dies on the MCM, which may be other compute dies or subsidiary dies that provide I/O, memory, or other peripheral functions.

Compute dies tend to be larger and more complex than other types of chiplets, and thus tend to have longer design, development, and production cycles compared to other types of chiplets. As a result, during development of an MCM, some of the individual component dies for the MCM (e.g., I/O, memory controller, other subsidiary dies) may be available in silicon before other individual components (e.g., the compute die). Because the compute die is usually the hardware that initializes the entire MCM system and that drives traffic to the I/O chiplets, validation, testing, or debugging of the other chiplets cannot start until the compute die becomes available in silicon, which means a waste of valuable days, weeks, or months that could otherwise be used to validate the non-compute dies and the MCM substrate connections to them. The same problem may occur in MCMs that have a dedicated initialization die different from the main compute die (e.g., a system control processor, etc.): validation, testing, or debugging of the subsidiary dies that rely on the initialization die for initialization will be delayed until the initialization die is available in silicon.

Techniques for validation, testing, and debugging of subsidiary dies without requiring a main die are presented herein. In some aspects, one or more of the subsidiary dies include a validation built-in self-test (VBIST) engine (which may be referred to herein simply as "VBIST") that can perform multiple functions, including, but not limited to: performing some boot functions, such as initializing the system memory and/or control registers; performing memory tests; validating interfaces at the rated speed; verifying inter-chiplet connections on the MCM substrate; and other useful operations.

Figure 1B:
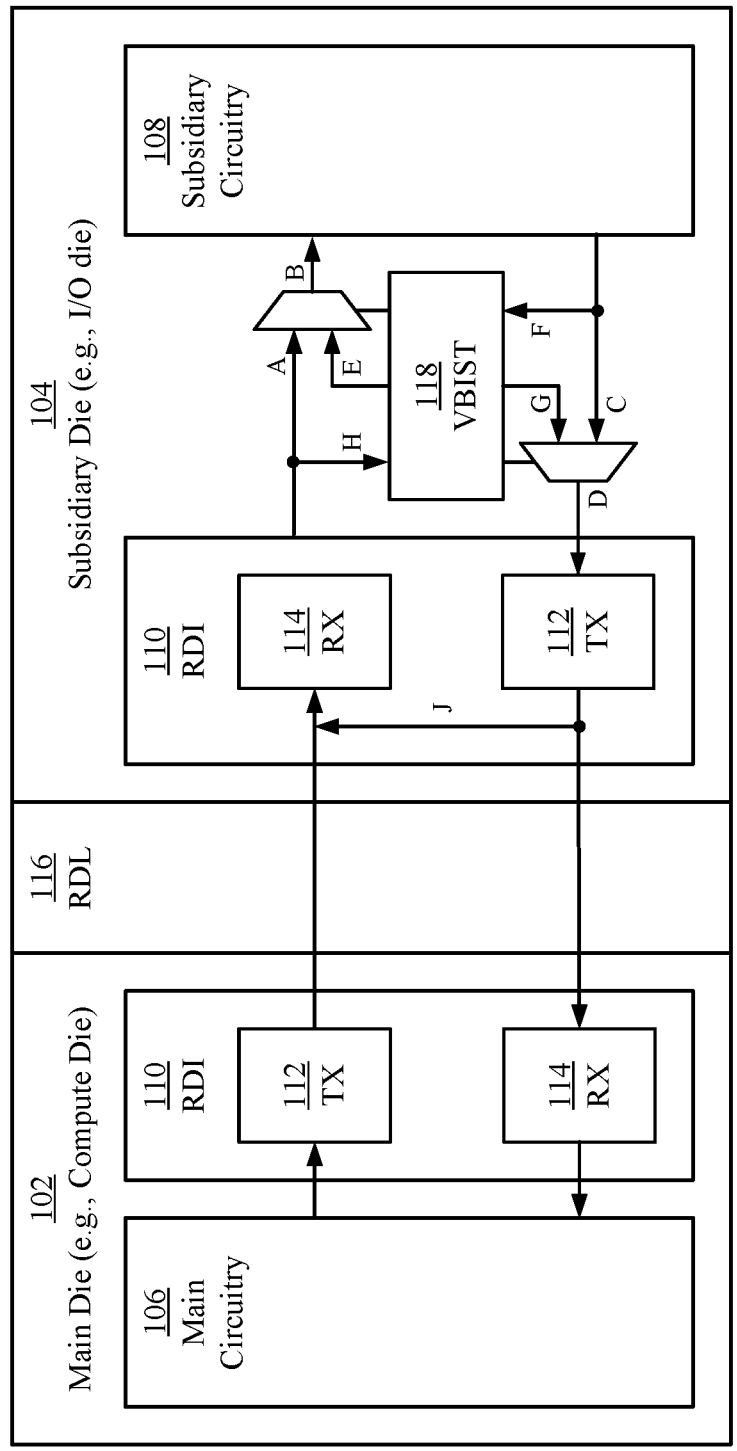

FIGS. 1A and 1B are block diagrams of portions of an example multi-chip module (MCM) 100 that uses a VBIST, according to aspects of the disclosure. FIG. 1A shows that the MCM 100 includes a main die 102 and multiple subsidiary dies 104 that communicate with the main die 102 and may also communicate with other subsidiary dies 104. Examples of a subsidiary die 104 include, but are not limited to, I/O dies, peripheral dies, memory controllers, memories, and dies that perform other subsidiary functions.

FIG. 1B illustrates the main die 102 and one of the subsidiary dies 104 in more detail. In the example illustrated in FIG. 1B, the main die includes compute circuitry 106 and the subsidiary die 104 includes subsidiary circuitry 108. Both the main die 102 and the subsidiary die 104 include a rapid die interconnect circuit (RDI) 110. Each RDI 110 includes a transmitter 112 and a receiver 114. The RDI 110 provides a fast connection (in some aspects, a high-speed serial interface) between the main die 102 and the subsidiary die 104 via a resource distribution layer (RDL) 116 or other type of package interconnect structure, e.g., on or within the MCM substrate. Although the examples below will refer to RDL 116, it will be understood that other types of package interconnect may be used instead of or in addition to an RDL.

As shown in FIG. 1B, the subsidiary die 104 includes a VBIST 118. In some aspects, the VBIST 118 can emulate traffic to and from the main die 102. In some aspects, when the VBIST 118 is inactive, data goes from the RDI 110 to the subsidiary circuitry 108 via path A and B, and data goes from the subsidiary circuitry 108 to the RDI 110 via path C and D. In some aspects, when the VBIST 118 is active, it can use additional paths E, F, G, and H for testing and validation purposes. As used herein, the term "flit" refers to a packetized collection of control fields and identifiers that communicate a protocol message.

In some aspects, the VBIST 118 can use paths E and B to send test patterns to the subsidiary circuitry 108 and use path F to receive the results, which the VBIST 118 can then check for correctness. This is useful when the subsidiary die 104 is a memory controller that is coupled to an internal or external memory, in which case the VBIST 118 may be used to perform memory tests to verify the proper operation of the memory controller and/or the memory itself, without assistance from the main die 102.

In some aspects, the VBIST 118 can use paths F, E, and B to create an internal loopback for the subsidiary circuitry 108. This is useful to allow the subsidiary circuitry 108 to generate its own test data which it transmits to itself without going through the RDI 110 on the subsidiary die 104, in case the RDI 110 is not working properly.

In some aspects, the VBIST 118 can use paths G and D to send test patterns to the RDI 110 and use path H to receive the results, which the VBIST 118 can then check for correctness. In some aspects, the RDI 110 on the subsidiary die 104 can use path J to connect its transmitter TX 112 directly to its receiver RX 114 in a local loopback configuration. This is useful to allow the VBIST 118 to test the functionality of the RDI 110 on the subsidiary die 104 without requiring the presence and correct operation of the main die. For example, the VBIST 118 can test the RDI 110 by driving random data into the TX 112 of the RDI 110 on the subsidiary die 104 and checking the flits (which may be coherent hub interface (CHI) flits in some aspects) coming from the RX 114 on the subsidiary die 104 to ensure that no bits were corrupted.

In some aspects, the VBIST 118 can use paths G, D, J, A, and B to send test patterns to the subsidiary circuitry 108 via the RDI 10 and use path F to receive the results, which the VBIST 118 can then check for correctness. In some aspects, the VBIST 118 can use paths G, D, J, A, and B to stimulate the subsidiary circuitry 108; the VBIST 118 can then use paths C, D, J, and H to check that the response of the subsidiary circuitry 108 is correct. In some aspects, the VBIST 118 can use paths E and B to send test patterns to the subsidiary circuitry 108 and use paths C, D, J, and H to receive the results, which the VBIST 118 can then check for correctness. These modes are useful to allow the VBIST 118 to test the functionality of the subsidiary circuitry 108 and the RDI 110 together without requiring the presence and correct operation of the main die.

In some aspects, the VBIST 118 can use paths H, G, and D to create an internal loopback for the RDI 110. This allows an RDI 110 on the main die 102 or the subsidiary die 104 to confirm the proper operation of the RDI connection between the main die 102 and the subsidiary die 104. For example, the RDI 110 on the main die 102 can transmit some data to the RDI 110 on the subsidiary die 104; the VBIST 118 uses paths H, G, and D to loop that data back to the RDI 110 on the subsidiary die 104, which sends the data back to the RDI 110 on the main die 102; and the RDI 110 on the main die 102 confirms that the data received is the correct. The data paths described above, and the example uses of those data paths described above, are illustrative and not limiting. For example, in some aspects, the VBIST 118 could be used in a subsidiary die 104 that does not have an RDI 110. Likewise, the test patterns that the VBIST 118 generates are not limited to just memory test patterns, but can be any type of test pattern, including generation of random data, pseudorandom data, or structured data, and including generation of data that adheres to a particular protocol or data that does not adhere to a particular protocol.

In some aspects, the VBIST 118 may contain state machines or other hardware for the purpose of initializing the subsidiary circuitry 108 and preparing it to receive the test patterns. This is particularly valuable when testing the subsidiary die 104 standalone or in a validation MCM. In some aspects, VBIST 118 may use path E and B to send commands to the subsidiary circuitry 108 and path F to receive responses.

Figure 2:
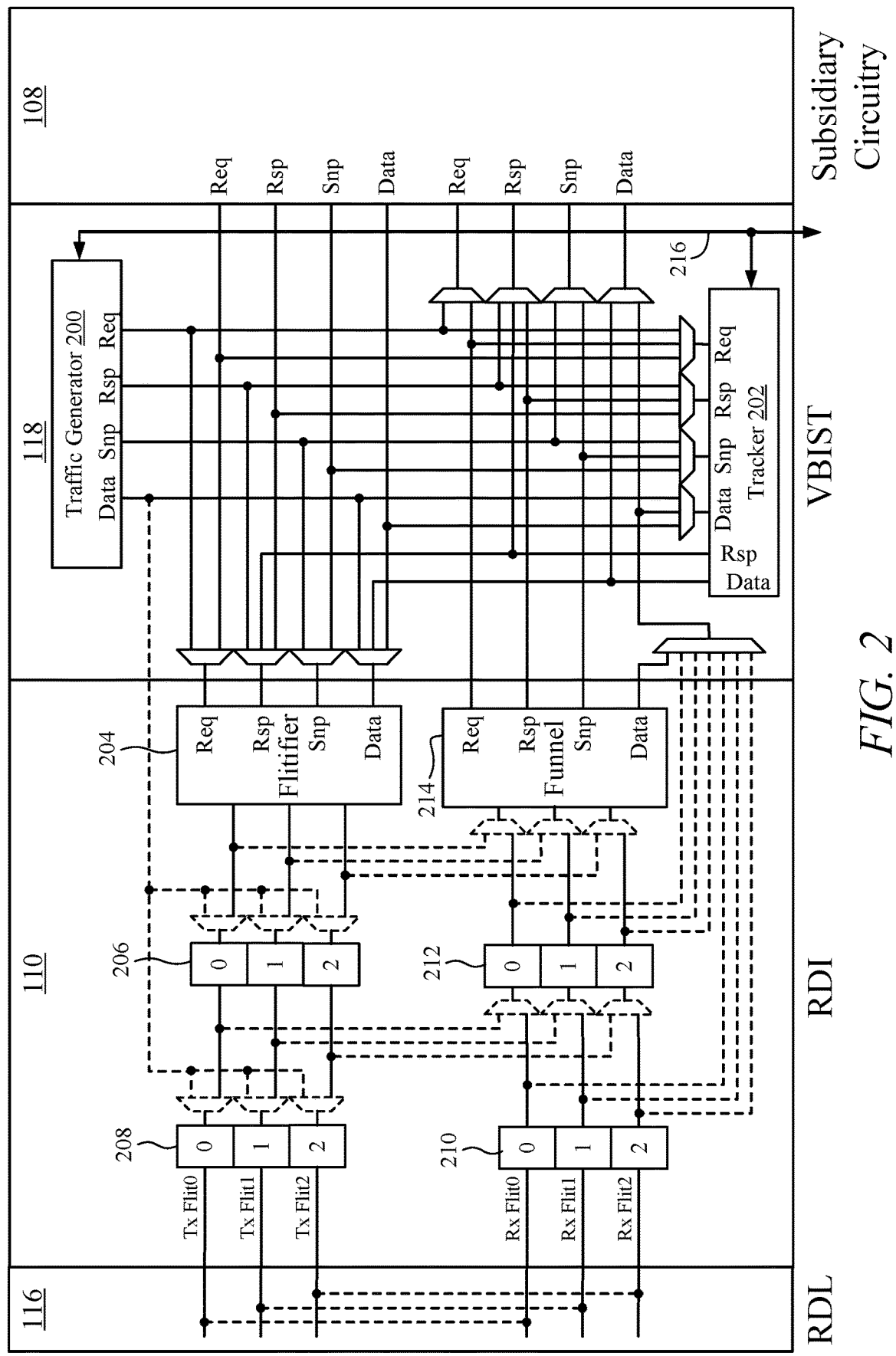
FIG. 2 is a simplified schematic of a VBIST engine and enhanced rapid die interconnect (RDI), according to aspects of the disclosure.

FIG. 2 is a simplified schematic of a VBIST 118 and enhanced RDI 110, according to aspects of the disclosure. In the example illustrated in FIG. 2, the VBIST 118 includes a traffic generator 200 and a tracker 202. In some aspects, circuits shown in FIG. 2 are parts of a component die that is to be part of a multi-chip module configured to support a main die that controls the component die. The VBIST 118 allows validation of the component die when the main die is absent or non-functional.

In the example illustrated in FIG. 2, the traffic generator 200 generates traffic that may be directed towards the RDI 110, the subsidiary circuitry 108, or the tracker 202. In some aspects, the traffic generator 200 can generate traffic according to a protocol. For example, in some aspects, the traffic generator 200 can create traffic according to a memory access protocol, a serial bus protocol, a peripheral bus protocol, and so on. In some aspects, the traffic generator 200 may implement a state machine, such as a communications bus state machine, etc.

In the example illustrated in FIG. 2, the tracker 202 can receive and check data that has come from the RDI 110, the subsidiary circuitry 108, or the traffic generator 200. In some aspects, the tracker 202 can generate data that may be directed towards the RDI 110 or the subsidiary circuitry 108. For example, in some aspects, the tracker 202 may generate random, pseudorandom, or sequential data in situations where it is not necessary to generate data according to a particular protocol or where it is not necessary to maintain a state machine.

In some aspects, each traffic generator 200 may have multiple (e.g., four) data stream generators that operate in parallel, e.g., to generate CHI flits. In some aspects, each stream may issue read or write requests with common CHI parameters, e.g., quality of service (QoS). In some aspects, each stream has a unique address range and stride. In some aspects, each stream may have its own data generator. In some aspects, each data generator may send a fixed data pattern, a rotating data pattern, a data=address pattern, a grayscale pattern, or other type of data pattern.

In some aspects, the tracker 202 monitors each outstanding request. In some aspects, when a CHI flit arrives at the tracker 202, the tracker 202 checks for data correctness (e.g., against expected values) and/or protocol correctness (e.g., that the response was an appropriate one). In some aspects, the tracker 202 may send CHI response and data flits as required to complete the read/write flows. In some aspects, the tracker 202 may report errors and debug information in secure control and status registers (CSRs). In this manner, detailed debug information may be logged in a way that an operator can access it. In some aspects, this information may be accessed via memory reads from software. In some aspects, this information may be accessed via a joint test action group (JTAG) test port.

FIG. 2 also illustrates an enhanced RDI 110 according to aspects of the disclosure. In the example illustrated in FIG. 2, elements displayed with solid lines represent conventional RDI components and elements displayed with dashed lines represent additional components added to the conventional RDI components for use by the VBIST 118. These additional elements provide different levels of loopback within the RDI 110.

In the example illustrated in FIG. 2, the RDI 110 includes a flitifier 204, which is a packetizer that receives CHI flits on the request (Req), response (Rsp), snoop (Snp), and data (Data) channels, and packetizes them into 172-bit flits, which are the structures used for the die-to-die communication. In the example illustrated in FIG. 2, the RDI 110 includes a transmit circuit 206, which appends cyclic redundancy check (CRC) values to the flits and which handles retries, and a transmit physical interface (PHY) 208 that includes I/O buffers that are connected to the physical connections of the RDL 116. In the example illustrated in FIG. 2, the RDI 110 includes a receive PHY 210, a receive circuit 212, and a funnel 214, which is a depacketizer that depacketizes the flits into CHI flits for analysis by the tracker 202. In the example illustrated in FIG. 2, the VBIST 118 includes an interface 216 by which one VBIST can communicate and coordinate with another VBIST.

Figure 3:
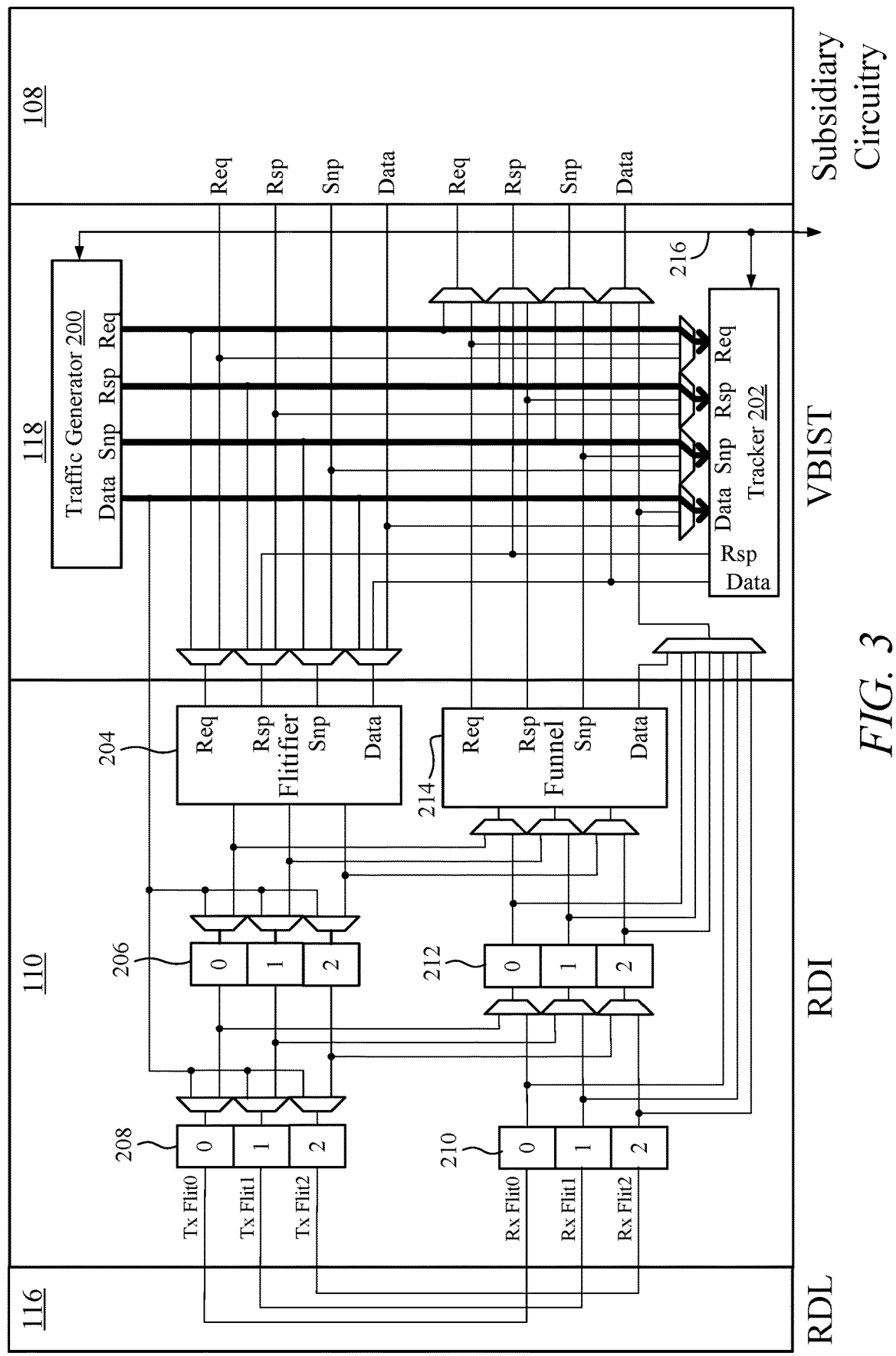
FIG. 3 illustrates a VBIST self-test mode, according to aspects of the disclosure.

FIG. 3 illustrates a VBIST 118 self-test mode, according to aspects of the disclosure. In the example illustrated in FIG. 3, the traffic generator 200 generates data that is sent directly to the tracker 202, which checks the data to make sure that the traffic generator 200 and the tracker 202 are operating correctly. This is useful to verify the correct operation of the VBIST 118.

In some aspects, the VBIST 118 includes an RDI test mode. In some aspects, the traffic generator 200 generates CHI flits on all channels into the RDI 110 at full speed. The data does not need to be protocol compliant: any data pattern, e.g., random, pseudorandom, sequential, etc., can be used. In the RDI test mode, the tracker 202 checks the CHI flits coming back out of the RDI 110 to ensure that none of the bits were corrupted.

Figure 4A:
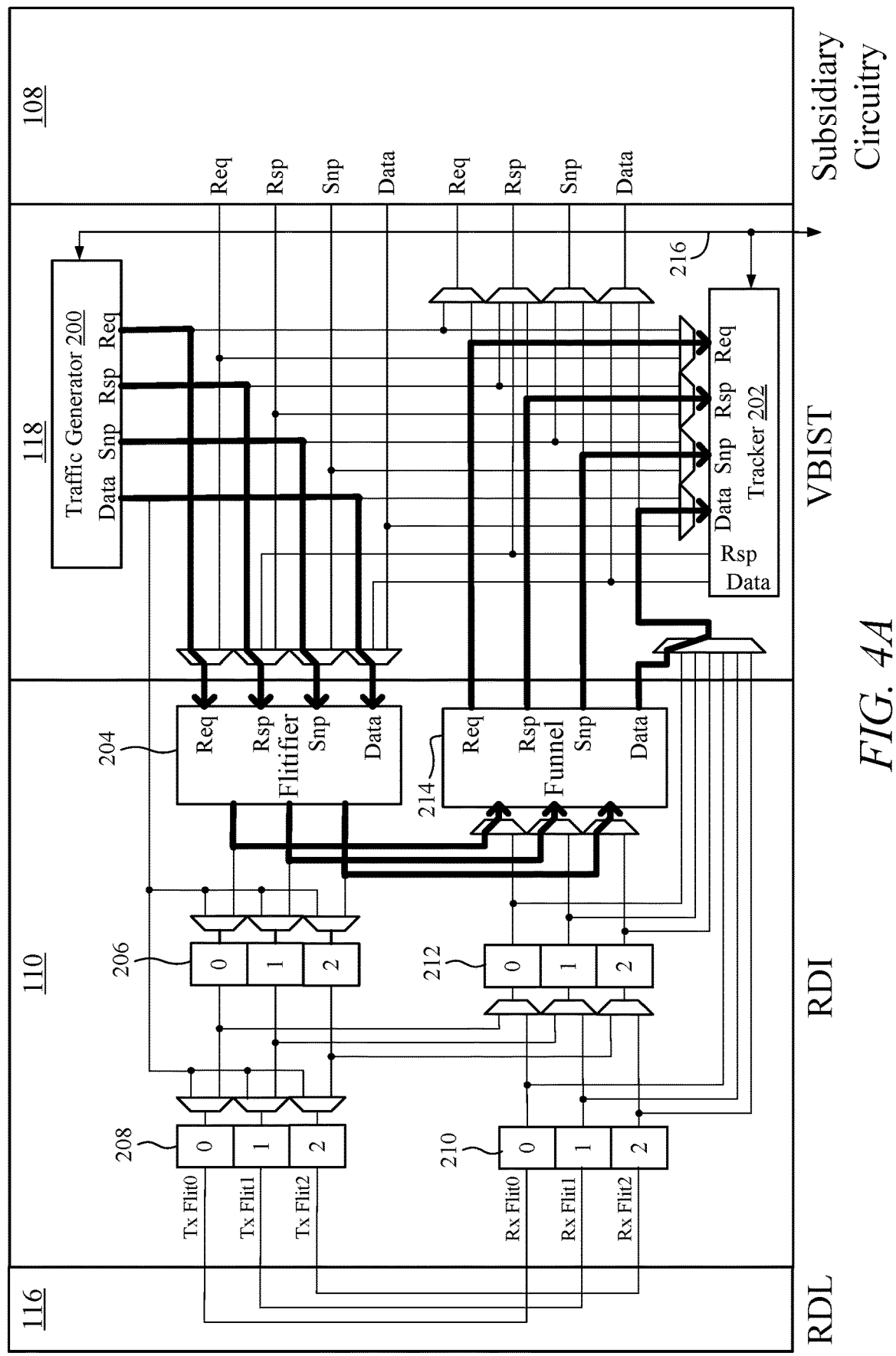
FIG. 4A, FIG. 4B, and FIG. 4C illustrate VBIST loopback modes available to validate the enhanced RDI, according to aspects of the disclosure.
Figure 4B:
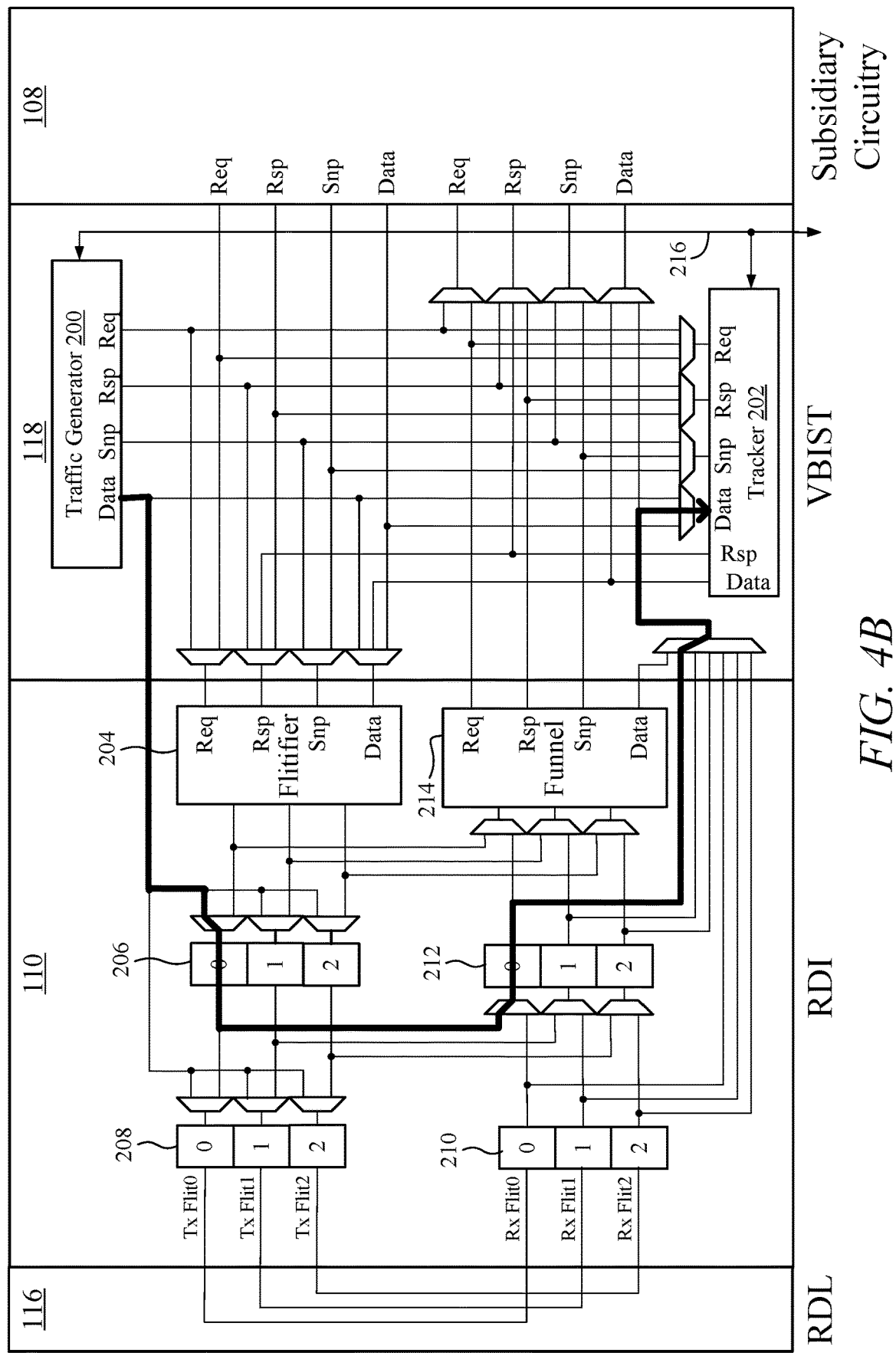
Figure 4C:
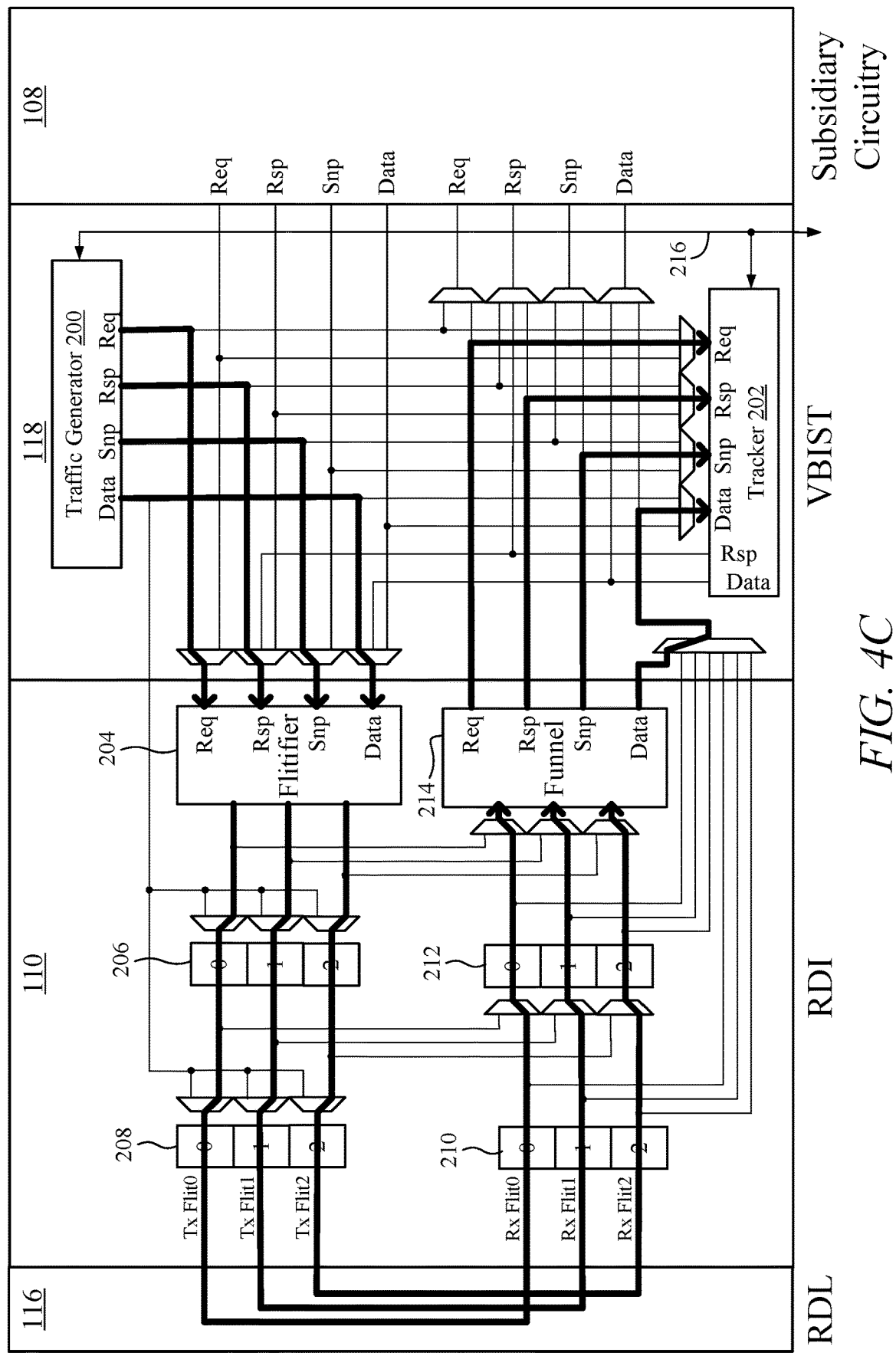

FIG. 4A, FIG. 4B, and FIG. 4C illustrate some loopback modes available to validate the enhanced RDI 110, according to aspects of the disclosure.

FIG. 4A illustrates a packetizer/depacketizer only loopback mode, in which the data path is from the traffic generator 200 to the flitifier 204, from the flitifier 204 to the funnel 214, and from the funnel 214 to the tracker 202.

FIG. 4B illustrates a transmit/receive circuit only loopback mode, in which the data path is from the traffic generator 200 directly to the transmit circuit 206, from the transmit circuit 206 to the receive circuit 212, and from the receive circuit 212 to the tracker 202.

FIG. 4C illustrates a flitifier/funnel, circuit, and PHY loopback mode, in which the data path is from the traffic generator 200 to the flitifier 204, from the flitifier 204 to the transmit circuit 206, from the transmit circuit 206 to the transmit PHY 208, from the transmit PHY 208 to the receive PHY 210, from the receive PHY 210 to the receive circuit 212, from the receive circuit 212 to the funnel 214, and from the funnel 214 to the tracker 202.

Other RDI loopback modes that are available, but not shown in a figure, include:

- A PHY-only loopback mode, in which the data path is from the traffic generator 200 to the transmit PHY 208, from the transmit PHY 208 to the receive PHY 210, and from the receive PHY 210 to the tracker 202;
- A transmit/receive circuit and PHY loopback mode, in which the data path is from the traffic generator 200 to the transmit circuit 206, from the transmit circuit 206 to the transmit PHY 208, from the transmit PHY 208 to the receive PHY 210, from the receive PHY 210 to the receive circuit 212, and from the receive circuit 212 to the tracker 202; and
- A flitifier/funnel and transmit/receive circuit loopback mode, in which the data path is from the traffic generator 200 to the flitifier 204, from the flitifier 204 to the transmit circuit 206, from the transmit circuit 206 to the receive circuit 212, from the receive circuit 212 to the funnel 214, and from the funnel 214 to the tracker 202.

In some aspects, the VBIST 118 includes a component die test mode. In aspects in which subsidiary die 104 is an I/O device, for example, the traffic generator 200 generates protocol-compliant read and write requests to the subsidiary circuitry 108 at full speed and/or at full bandwidth, and the tracker 202 checks for protocol-correct responses and/or checks for data correctness.

Figure 5A:
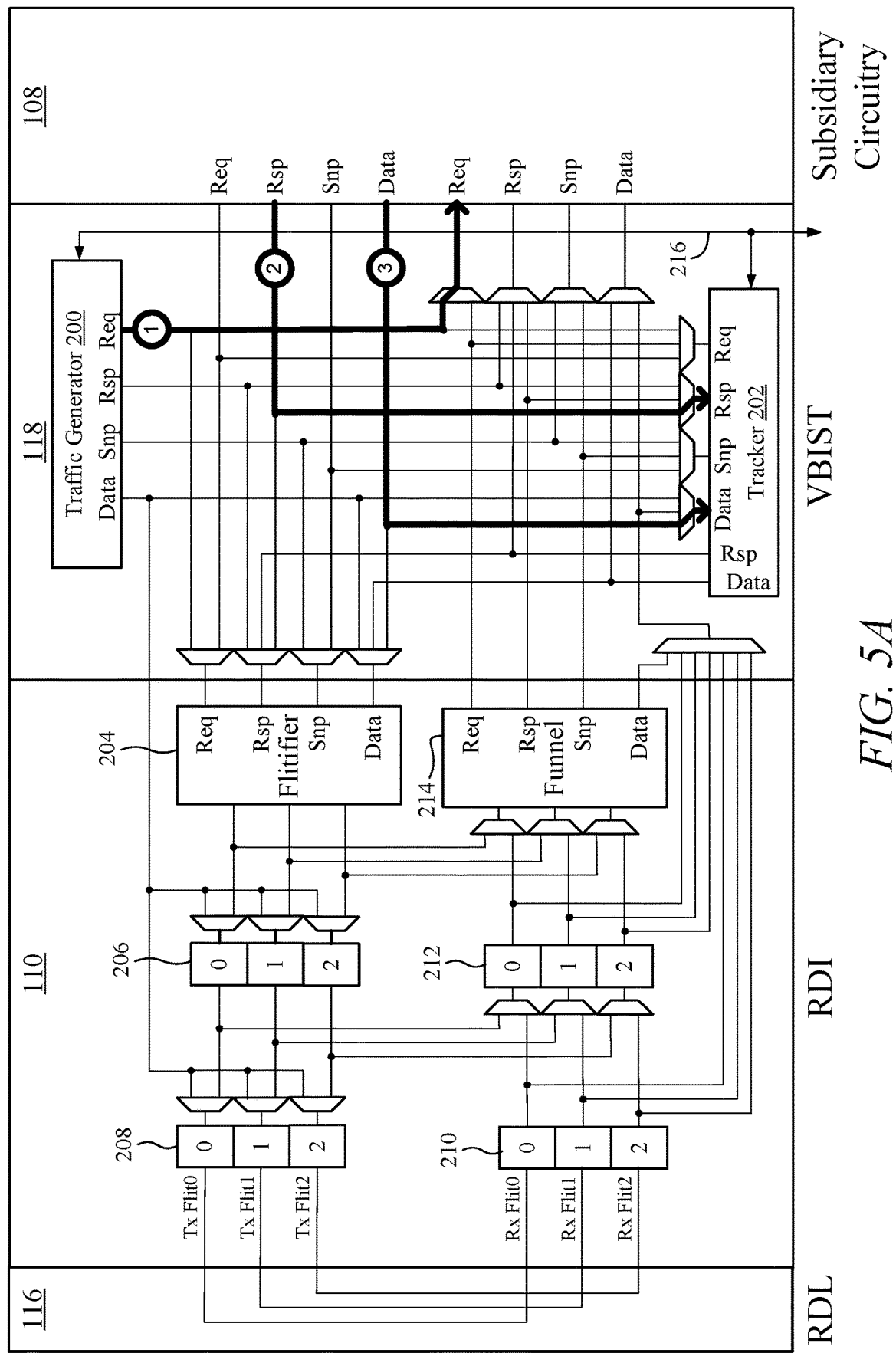
FIG. 5A, FIG. 5B, and FIG. 5C illustrate VBIST subsidiary die test modes, according to aspects of the disclosure.
Figure 5B:
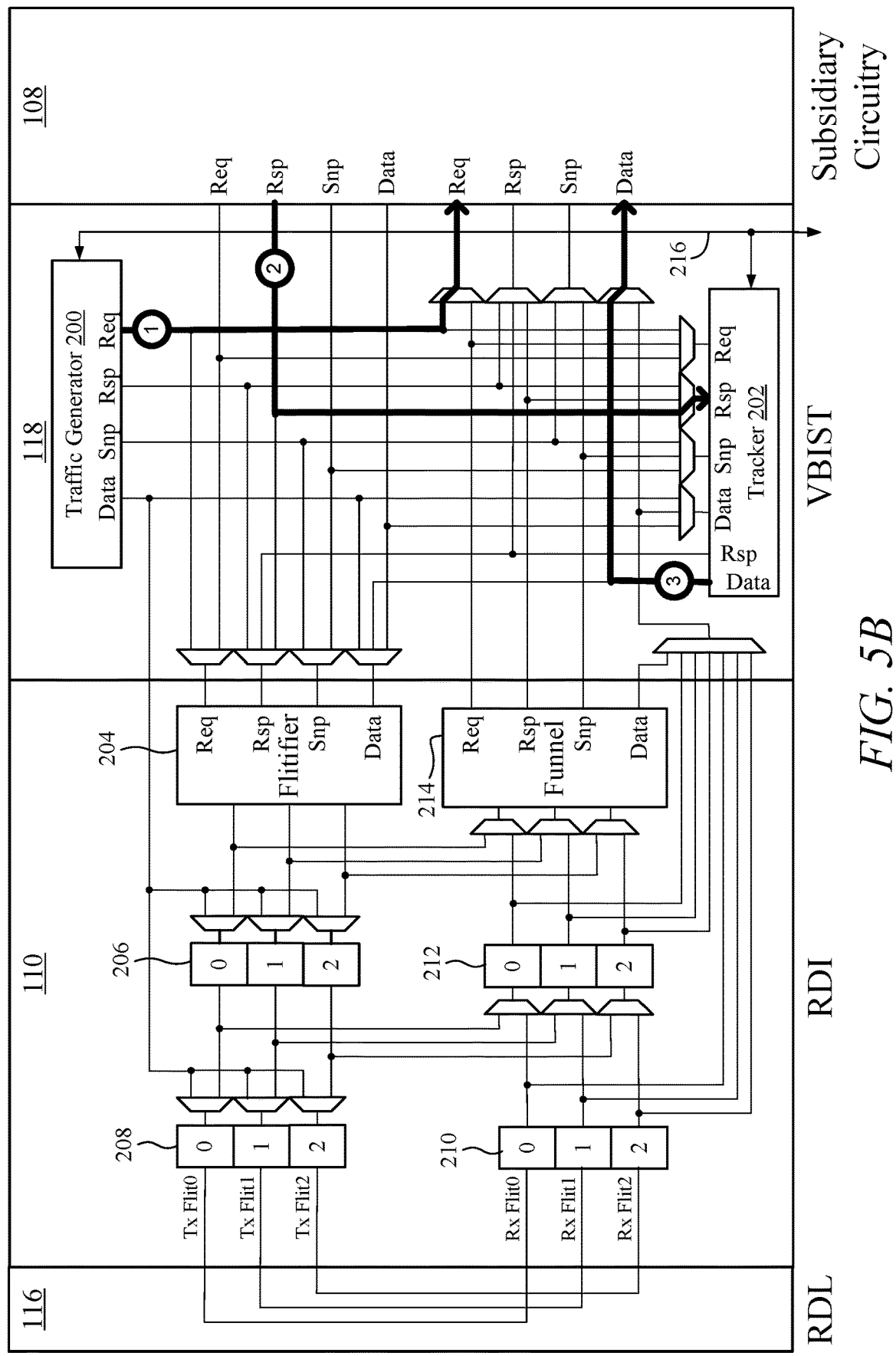
Figure 5C:
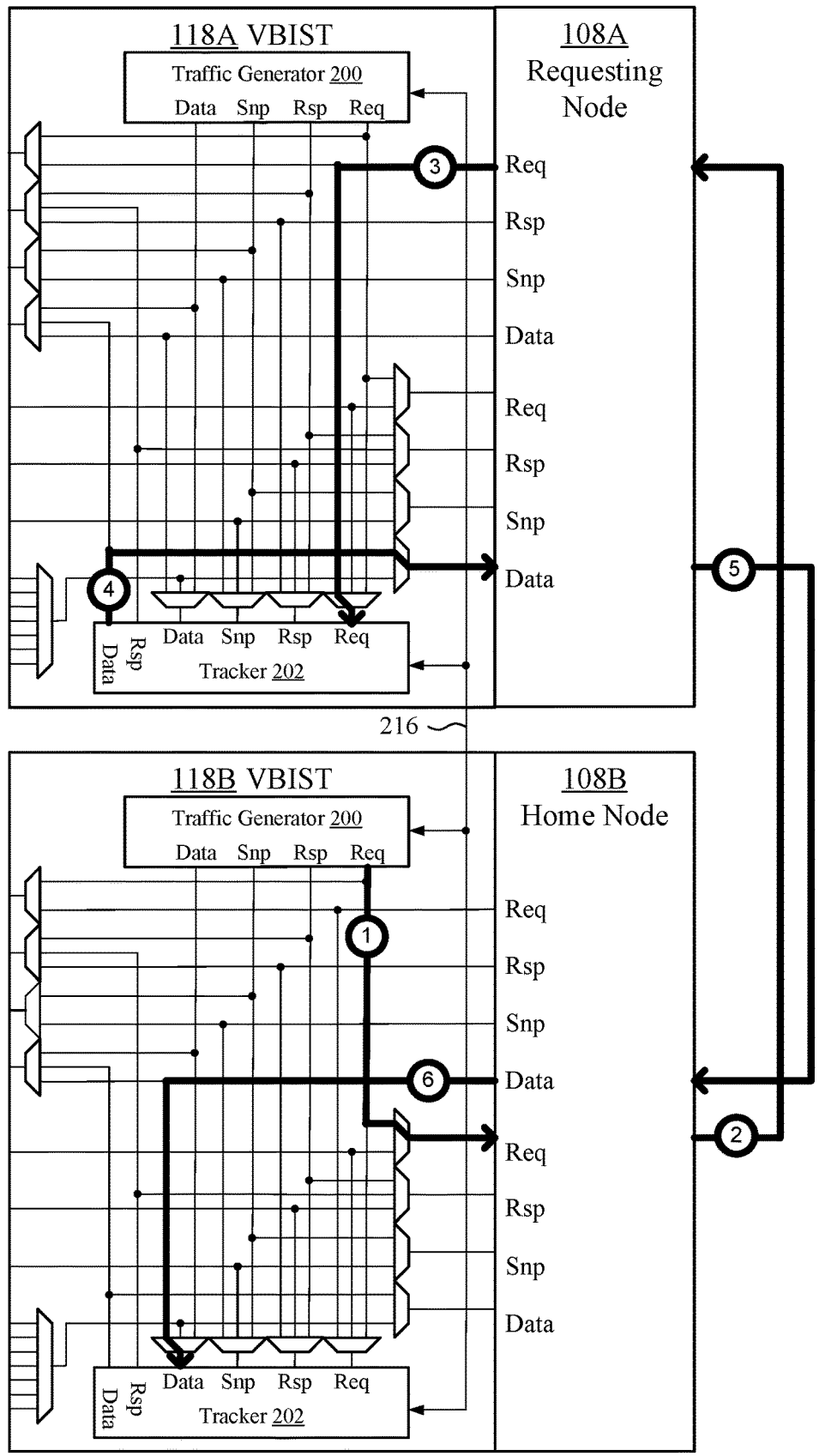

FIG. 5A, FIG. 5B, and FIG. 5C illustrate some component die test modes, according to aspects of the disclosure. In the examples shown in FIGS. 5A-5C, the subsidiary die 104 may be a memory controller, a serial bus controller, etc.

FIG. 5A illustrates a read test mode in which the traffic generator 200 generates a read request to the subsidiary circuitry 108 (e.g., via Req). The subsidiary circuitry 108 processes the read request and sends a response to the tracker 202 (e.g., via Rsp and Data). If the subsidiary die 104 is a memory controller, for example, the request may be a memory read, and the response may be an acknowledgement (ACK) of the read and the read data.

FIG. 5B illustrates a write test mode in which the traffic generator 200 generates a write request to the subsidiary circuitry 108 (e.g., via Req) and the tracker 202 provides the write data to the subsidiary circuitry 108 (e.g., via Data), e.g., since the data flit may be generated in response to the response flit that arrived at the tracker 202 and may be based on the information currently stored in the tracker 202. In some aspects, the write data may be provided to the subsidiary circuitry 108 by the traffic generator 200 rather than the tracker 202. In some aspects, the tracker 202 may provide or indicate to the traffic generator 200 what write data should be generated by the traffic generator 200, and the data flit may be sent from the traffic generator 200 to the subsidiary circuitry 108. The subsidiary circuitry 108 processes the write request and sends a response to the tracker 202 (e.g., via Rsp). If the subsidiary die 104 is a memory controller, for example, the request may be a memory write, and the response may be an acknowledgement (ACK) or negative acknowledgement (NACK) indicating the success or failure of the write.

The read operation shown in FIG. 5A and the write operation shown in FIG. may be used to not only test the subsidiary circuitry 108 but also used to test memory devices and other types of devices that are attached to the subsidiary circuitry 108 and/or the subsidiary die 104 (presuming that the subsidiary circuitry 108 is operating correctly). This allows the VBIST 118 to be used to perform BIST of not only components within the subsidiary die 104 but also of components outside of, but communicatively coupled to, the subsidiary die 104.

In some aspects, the VBIST 118 includes a DRAM initialization mode. In some aspects, the traffic generator 200 can be used to efficiently initialize memory during boot, which may be required for proper error correction code (ECC) operation. For MCMs having many subsidiary dies 104, using the VBIST 118 rather than the main die 102 to initialize memory during boot can significantly reduce the memory initialization time due to the parallel operation on the subsidiary dies 104, instead of a serial operation by the main die 102 to initialize each die's memories one by one.

FIG. 5C illustrates a serial bus loopback mode, according to aspects of the disclosure. FIG. 5C illustrates a peripheral component interconnect express (PCIe) loopback mode, but the same principles may be applied to other bus protocols. In the example illustrated in FIG. 5C, the top VBIST 118A is part of a requesting node 108A that supports distributed virtual memory (DVM) operations and the bottom VBIST 118B is part of a home node 108B. In some aspects, DVM operations comprise a set of special request and snoop protocols that are used to update the virtual memory tables throughout the system. FIG. 5C illustrates an example in which one VBIST instance (VBIST 118B) sends a request into the PCIe root complex (RC), and the request is reflected out on a different CHI port to a different VBIST instance (VBIST 118A); the second VBIST instance (VBIST 118A) will respond to the first VBIST instance (VBIST 118B) to complete the flow, with all traffic flowing through the PCIe RC.

In the example illustrated in FIG. 5C, the traffic generator 200 of the bottom VBIST 118B sends a read request to the home node 108B (via Req). The read request is looped through the PCIe RC from the home node 108B to the requesting node 108A, which provides the read request to the tracker 202 of the top VBIST 118A (via Req). The tracker 202 of the top VBIST 118A receives the read request from the requesting node 108A and responds with read data, which is sends to the requesting node 108A (via Data). The read data is looped through the PCIe RC from the requesting node 108A to the home node 108B, which provides the read data to the tracker 202 of the bottom VBIST 118B. The top VBIST 118A and the bottom VBIST 118B may communicate and coordinate with each other using the interface 216. In a similar manner, the traffic generator 200 of the bottom VBIST 118B may use the paths described above to issue write requests.

In some aspects, the VBIST 118A or VBIST 118B may include additional logic to send commands on a sideband interface into the PCIe RC, e.g., a porter utility bus (PUB), in order to prepare the PCIe RC to receive traffic. In some aspects, the VBISTs may include additional hardware for initializing the component dies in a standalone mode.

Figure 6:
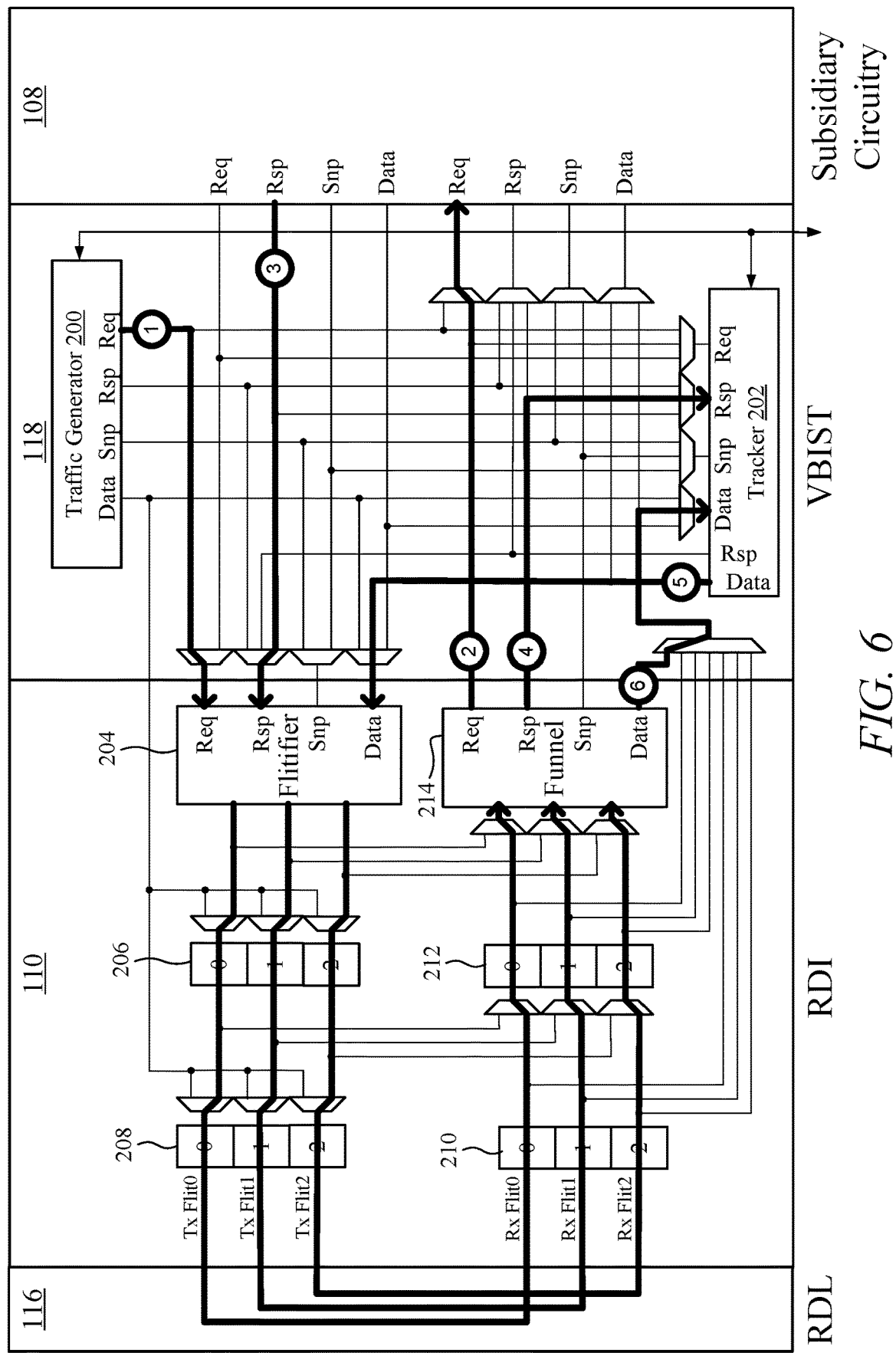
FIG. 6 illustrates another mode of operation of the VBIST engine, according to aspects of the disclosure.

FIG. 6 illustrates yet another mode of operation of the VBIST 118, according to aspects of the disclosure. FIG. 6 illustrates an example showing an interaction that involves the subsidiary circuitry 108, the VBIST 118, the RDI 110, and the RDL 116. In the example illustrated in FIG. 6, the traffic generator 200 generates a request that travels through the RDI transmit chain to the RDL, which loops the request back through the RDI receive chain to the subsidiary circuitry 108. The subsidiary circuitry 108 receives the request and provides a response. The response from the subsidiary circuitry 108 also travels though the RDI transmit chain, the RDL, and the RDI receive chain to the tracker 202. In this example, the tracker 202 also provided data, which traveled through the RDI transmit chain, RDL, and RDI receive chain to arrive back at the tracker 202.

In some aspects, when the traffic generator 200 issues a request, it also allocates an entry in the tracker 202. In some aspects, the tracker entry stores some minimum amount of information needed to generate data on demand. For example, in some aspects, the tracker entry stores the address, stream generator ID, and a data rotation value. In some aspects, this information, combined with 512-bits of user-programmable random data (per stream generator) is used to generate the data flit. In an alternative aspect, a full 512-bit data pattern is stored in each tracker entry.

This example illustrates the point that the traffic generator 200 can indirectly interact with the subsidiary circuitry 108, e.g., by emulating the operations of the main die 102 on the other end of an RDL 116.

Figure 7:
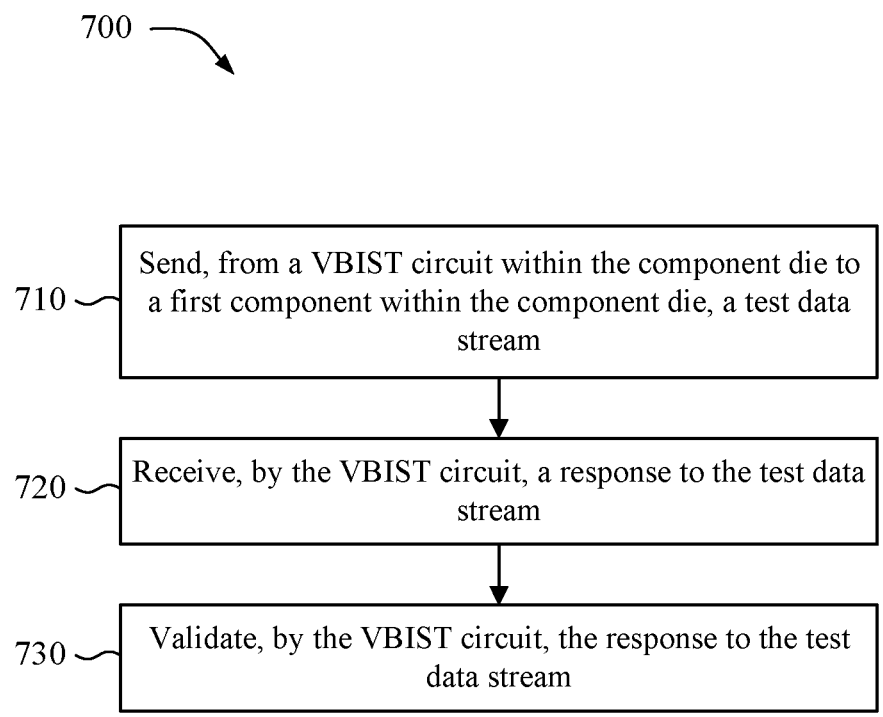
FIG. 7 is a flowchart of an example process associated with validation of a component die, according to aspects of the disclosure.

FIG. 7 is a flowchart of an example process 700 associated with validating a component die in an MCM, according to aspects of the disclosure. In some aspects, the component die may be a subsidiary die. In some aspects, the component die may be a main die. In some implementations, one or more process blocks of FIG. 7 may be performed by the VBIST 118 and the RDI 110. In some implementations, one or more process blocks of FIG. 7 may be performed by another device or a group of devices separate from or including the VBIST 118. Additionally, or alternatively, one or more process blocks of FIG. 7 may be performed by one or more components of an apparatus, such as a processor(s), memory, or transceiver(s), any or all of which may be means for performing the operations of process 700.

As shown in FIG. 7, process 700 may include, at block 710, sending, from a VBIST circuit within the component die to a first component within the component die, a test data stream.

As further shown in FIG. 7, process 700 may include, at block 720, receiving, by the VBIST circuit, a response to the test data stream.

As further shown in FIG. 7, process 700 may include, at block 730, validating, by the VBIST circuit, the response to the test data stream.

In some aspects, receiving the response to the test data stream comprises receiving the response from the first component or from a second component different from the first component.

In some aspects, sending the test data stream to the first component comprises sending the test data stream to first circuitry for performing a component function. In some aspects, receiving the response from the second component comprises receiving the response from second circuitry for communicating with a second component die.

In some aspects, sending the test data stream to the first component comprises sending the test data stream to second circuitry for communicating with a second component die. In some aspects, sending the test data stream to the second circuitry for communicating with a second component die comprises sending the test data stream to the second circuitry configured in a loopback mode. In some aspects, receiving the response from the second component comprises receiving the response from first circuitry for performing a component function.

In some aspects, sending the test data stream to the first component comprises sending at least one of random traffic, sequential traffic, or traffic according to a protocol. In some aspects, sending the test data stream comprises sending a plurality of data streams in parallel.

In some aspects, sending the test data stream to the first component within the component die comprises sending memory initialization commands (e.g., memory write commands) to a memory controller within the component die. In some aspects, sending the test data stream to the first component within the component die further comprises sending memory read commands to the memory controller. In some aspects, receiving and validating the response to the test data stream comprises receiving and validating the read data from the memory controller.

Process 700 may include additional implementations, such as any single implementation or any combination of implementations described below and/or in connection with one or more other processes described elsewhere herein. Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In some aspects, such as where subsidiary dies 104 of an MCM 100 are available in silicon but the main die 102 is not, the non-compute portions of the MCM 100 may be validated by providing a temporary replacement for the main die 102, which may be referred to as a validation engine. An example of this is shown in FIG. 8.

Figure 8:
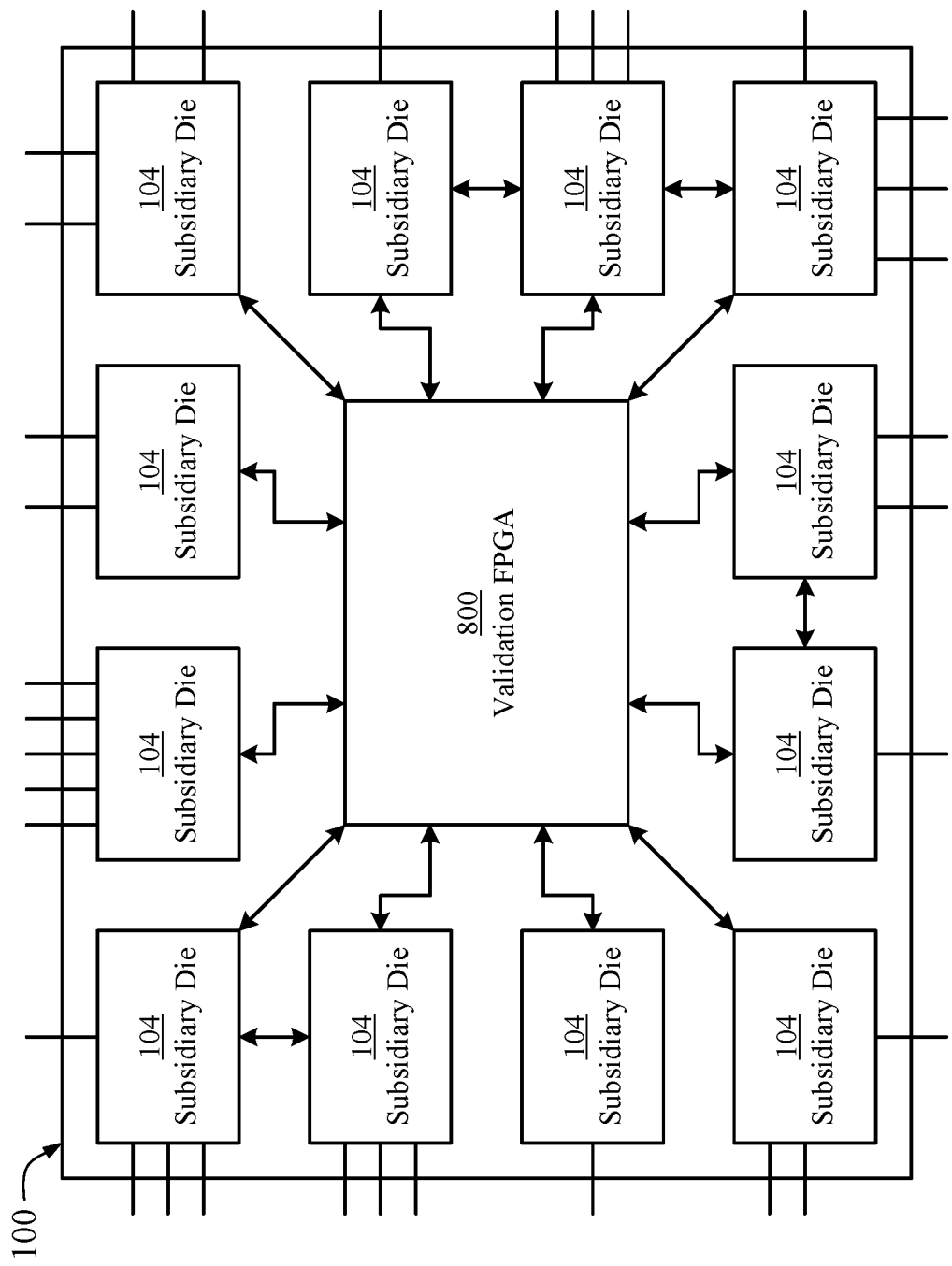
FIG. 8 is a block diagram of an example MCM in which a validation FPGA is used as a substitute for a main die.

FIG. 8 is a block diagram of an example MCM in which a validation FPGA 800 is used as a substitute for a main die 102. In some aspects, the validation FPGA 800 need only provide the minimum logic needed to validate a subset of the operations that the main die 102 would have performed. For example, in some aspects, the validation FPGA 800 will perform only the boot functions and system control functions.

In some aspects, the validation FPGA 800 may perform initialization functions, including, but not limited to, using a regular initialization flow to bring up security processor and/or management processor subsystems. Doing so allows validation of the interactions between a baseboard management controller (BMC) and other components of a system that uses the MCM 100. In some aspects, the validation FPGA 800 can initialize and bring up all of the subsidiary dies 104, and in this manner validate at least the substrate connections to the dies.

In some aspects, the validation FPGA 800 can coordinate and/or control the VBIST 118 of one or more of the subsidiary dies 104. In some aspects, the validation FPGA 800 enables access to the VBISTs by the management processor subsystem.

In some aspects, the FPGA 800 is a fully packaged FPGA that is mounted to the substrate of the MCM 100 via an interposer. For example, a fully packaged chip may be mounted to the substrate and the FPGA pins may then be connected to the package pins via metal vias.

The systems and methods disclosed herein have several technical advantages, such as the ability to reduce the time between design finalization and production by shifting certain validation activities to earlier in the chip-in-house cycle, which leads to faster time-to-market. Another advantage is the reduction in cost of defective silicon: the VBIST 118 can identify more I/O die defects before the dies are packaged, which leads to less waste of good silicon. Further, the methodology aids in validating the subsidiary dies 104 without the need of the main die 102 and also enables the validation of most of hardware platform before availability of the entire chip. The configuration shown in FIG. 8, or example, enables validation of many aspects of the platform (e.g., motherboards, sockets, attached memories, etc.) in addition to internal aspects (e.g., subsidiary die functionality, functionality of system components such as security processors, management processors, etc.).

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Various components as described herein may be implemented as application specific integrated circuits (ASICs), programmable gate arrays (e.g., FPGAs), firmware, hardware, software, or a combination thereof. Further, various aspects and/or embodiments may be described in terms of sequences of actions to be performed by, for example, elements of a computing device. Those skilled in the art will recognize that various actions described herein can be performed by specific circuits (e.g., an application specific integrated circuit (ASIC)), by program instructions being executed by one or more processors, or by a combination of both. Additionally, these sequences of actions described herein can be considered to be embodied entirely within any form of non-transitory computer-readable medium having stored thereon a corresponding set of computer instructions that upon execution would cause an associated processor to perform the functionality described herein. Thus, the various aspects described herein may be embodied in a number of different forms, all of which have been contemplated to be within the scope of the claimed subject matter. In addition, for each of the aspects described herein, the corresponding form of any such aspects may be described herein as, for example, "logic configured to", "instructions that when executed perform", "computer instructions to" and/or other structural components configured to perform the described action.

Those of skill in the art will further appreciate that the various illustrative logical blocks, components, agents, IPs, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, processors, controllers, components, agents, IPs, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium or non-transitory storage media known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An apparatus, comprising:
   a component die, comprising:
      component circuitry for performing a component function;
      interface circuitry for communicating with a compute die not containing the component circuitry for performing the component function and that controls the component die, the interface circuitry comprising a transmit chain for sending data to the compute die, the transmit chain comprising a packetizer and transmit circuit that creates packets appended with cyclic redundancy check (CRC) values; and
   a validation built-in self-test (VBIST) circuit, comprising:
      a traffic generator that generates test data streams;
      a tracker that receives and validates test data streams; and
      a configurable switching matrix capable of:
         providing a path for data to go from the traffic generator to the interface circuitry without going through the component circuitry or the tracker,
         providing a path for data to go from the traffic generator to the tracker without going through the component circuitry or the interface circuitry,
         providing a path for data to go from the component circuitry to the tracker without going through the interface circuitry, and
         providing a path for data to go from the interface circuitry to the tracker without going through the component circuitry,
      according to a mode of operation of the VBIST.

2. The apparatus of claim 1, wherein the component circuitry comprises at least one of an input/output circuit, a memory controller, or a serial bus controller.

3. The apparatus of claim 1, wherein the interface circuitry comprises a receive chain for receiving data from the compute die.

4. The apparatus of claim 3, wherein the transmit chain comprises a transmit physical interface, and wherein the receive chain comprises a receive physical interface, a receive circuit, and a depacketizer that receives packets appended with CRC values.

5. The apparatus of claim 4, wherein the interface circuitry is configurable to provide at least one loopback mode using a loopback path within the component die that couples the transmit chain to the receive chain to bypass the compute die.

6. The apparatus of claim 5, wherein the at least one loopback mode comprises at least one of:
 a packetizer to depacketizer loopback mode;
 a transmit circuit to receive circuit loopback mode;
 a transmit physical interface to receive physical interface loopback mode;
 a packetizer and transmit circuit to receive circuit and depacketizer loopback mode;
 a transmit circuit and transmit physical interface to receive physical interface and receive circuit loopback mode; and
 a packetizer, transmit circuit, and transmit physical interface to receive physical interface, receive circuit, and depacketizer loopback mode.

7. The apparatus of claim 1, wherein the VBIST circuit is configured to perform a self-test by sending traffic from the traffic generator directly to the tracker, which validates the traffic.

8. The apparatus of claim 1, wherein the VBIST circuit is configured to validate the interface circuitry by:
 sending traffic from the traffic generator to the interface circuitry;
 receiving, at the tracker, a response from the interface circuitry; and
 validating the response using the tracker.

9. The apparatus of claim 1, wherein the VBIST circuit is configured to validate the component circuitry by:
 sending traffic from the traffic generator to the component circuitry;
 receiving, at the tracker, a response from the component circuitry; and
 validating the response using the tracker.

10. The apparatus of claim 1, wherein the VBIST circuit is configured to validate the component circuitry by:
 sending traffic from the traffic generator to the interface circuitry in a loopback mode that loops the traffic back to the component circuitry using a loopback path within the component die that couples the transmit chain to the receive chain to bypass the compute die;
 receiving, at the tracker, a response from the component circuitry via the interface circuitry in the loopback mode; and
 validating the response using the tracker.

11. The apparatus of claim 1, wherein the VBIST circuit is configured to validate the component circuitry by:
 sending traffic from the traffic generator to the component circuitry;
 receiving a response from a second VBIST circuit via a second interface;
 providing the response to the tracker; and
 validating the response using the tracker.

12. The apparatus of claim 1, wherein the VBIST circuit is configured to perform a memory initialization by sending memory initialization commands from the traffic generator to the component circuitry.

13. The apparatus of claim 1, wherein the VBIST circuit is configured to perform a memory test by:
 sending memory write commands and memory read commands from the traffic generator to the component circuitry;
 receiving, at the tracker, responses to the memory write commands and the memory read commands from the component circuitry; and
 validating operation of the memory using the tracker.

14. The apparatus of claim 1, wherein the traffic generator comprises a plurality of data stream generators that operate in parallel.

15. The apparatus of claim 1 wherein the traffic generator generates at least one of random traffic, sequential traffic, or traffic according to a protocol.

16. The apparatus of claim 1, wherein the tracker also generates data streams.

17. The apparatus of claim 1, further comprising a validation engine communicatively coupled to the component die via the interface circuitry.

18. The apparatus of claim 17, wherein the validation engine comprises a field programmable gate array (FPGA).

19. The apparatus of claim 17, wherein the validation engine is configured to perform at least one of boot functions, system control functions, or initialization functions of the component die.

20. The apparatus of claim 17, wherein the validation engine is configured to at least one of initialize the component die, validate connections to the component die, and coordinate an operation of the VBIST circuit of the component die.

21. The apparatus of claim 1, wherein the VBIST circuit further comprises initialization circuitry for initializing the component die prior to performing a built-in self-test.

22. The apparatus of claim 1, wherein the component die is part of a multi-chip module configured to support the compute die that controls the component die, and wherein the VBIST circuit is configured to validate the component die when the compute die that controls the component die is absent or non-functional.

23. A method of validating a component die in a multi-chip module (MCM), the method comprising:
 at a validation built-in self-test (VBIST) circuit within the component die, the VBIST circuit comprising a traffic generator that generates test data streams, a packetizer and transmit circuit that creates packets appended with cyclic redundancy check (CRC) values, a tracker that receives and validates test data streams, and a configurable switching matrix capable of providing a path for data to go from the traffic generator to the interface circuitry without going through the component circuitry or the tracker, providing a path for data to go from the traffic generator to the tracker without going through the component circuitry or the interface circuitry, providing a path for data to go from the component circuitry to the tracker without going through the interface circuitry, and providing a path for data to go from the interface circuitry to the tracker without going through the component circuitry, according to a mode of operation of the VBIST:
 configuring the configurable switching matrix to provide a first path for data to go from the traffic generator to the interface circuitry without going through the component circuitry or the tracker, a second path for data to go from the interface circuitry to the component die without going through the tracker, and a third path for data to go from the component die to the tracker;
 generating a test data stream via the traffic generator;
 sending the test data stream to a first component within the component die via the first path and the second path;
 receiving, at the tracker, a response to the test data stream via the third path; and
 validating the response to the test data stream.

24. The method of claim 23, wherein receiving the response to the test data stream comprises receiving the response from the first component or from a second component different from the first component.

25. The method of claim 23, wherein sending the test data stream to the first component comprises sending the test data stream to first circuitry for performing a component function.

26. The method of claim 25, wherein receiving the response to the test data stream comprises receiving the response from second circuitry for communicating with a second component die.

27. The method of claim 23, wherein sending the test data stream to the first component comprises sending the test data stream to second circuitry for communicating with a second component die.

28. The method of claim 27, wherein sending the test data stream to the second circuitry for communicating with the second component die comprises sending the test data stream to the second circuitry configured in a loopback mode using a loopback path within the component die.

29. The method of claim 27, wherein receiving the response to the test data stream comprises receiving the response from first circuitry for performing a component function.

30. The method of claim 23, wherein sending the test data stream to the first component comprises sending at least one of random traffic, sequential traffic, or traffic according to a protocol.

31. The method of claim 23, wherein sending the test data stream comprises sending a plurality of data streams in parallel.

32. The method of claim 23, wherein sending the test data stream to the first component within the component die comprises sending memory initialization commands to a memory controller within the component die.

33. The method of claim 32, wherein sending the test data stream to the first component within the component die further comprises sending memory read commands to the memory controller, and wherein receiving and validating the response to the test data stream comprises receiving and validating read data from the memory controller.

34. The method of claim 23, further comprising initializing the component die prior to sending the test data stream to the first component within the component die.

35. A method of validating a component die in a multi-chip module (MCM), the method comprising:
providing, on a component die comprising component circuitry for performing a component function and interface circuitry for communicating with a compute die not containing the component circuitry for performing the component function and that controls the component die, a validation built-in self-test (VBIST) circuit, the VBIST circuit comprising a traffic generator that generates test data streams, a packetizer and transmit circuit that creates packets appended with cyclic redundancy check (CRC) values, a tracker that receives and validates test data streams, and a configurable switching matrix capable of providing a path for data to go from the traffic generator to the interface circuitry without going through the component circuitry or the tracker, providing a path for data to go from the traffic generator to the tracker without going through the component circuitry or the interface circuitry, providing a path for data to go from the component circuitry to the tracker without going through the interface circuitry, and providing a path for data to go from the interface circuitry to the tracker without going through the component circuitry, according to a mode of operation of the VBIST; and
using the VBIST circuit to validate at least one of the VBIST circuit, the component circuitry, or the interface circuitry.

* * * * *